US011567703B2

United States Patent
Ahn

(10) Patent No.: US 11,567,703 B2
(45) Date of Patent: Jan. 31, 2023

(54) MEMORY DEVICE COMPRISING QUEUE LAYER AND STORAGE DEVICE INCLUDING THE SAME

(71) Applicant: SK hynix Inc., Icheon-si (KR)

(72) Inventor: Sung Ho Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/446,110

(22) Filed: Aug. 26, 2021

(65) Prior Publication Data

US 2022/0291867 A1 Sep. 15, 2022

(30) Foreign Application Priority Data

Mar. 15, 2021 (KR) .......................... 10-2021-0033365

(51) Int. Cl.
    *G06F 3/06* (2006.01)
(52) U.S. Cl.
    CPC ............ *G06F 3/0659* (2013.01); *G06F 3/061* (2013.01); *G06F 3/0679* (2013.01)
(58) Field of Classification Search
    CPC ....... G06F 3/061; G06F 3/0659; G06F 3/0679
    See application file for complete search history.

(56) References Cited

U.S. PATENT DOCUMENTS

| 2009/0213659 | A1* | 8/2009 | Lee .......................... G11C 7/22 365/194 |
| 2018/0061478 | A1* | 3/2018 | Vergis ..................... G06F 13/16 |
| 2018/0336936 | A1* | 11/2018 | Chae ..................... G11C 7/1066 |
| 2021/0225418 | A1* | 7/2021 | Kwon ................... G11C 7/1084 |

FOREIGN PATENT DOCUMENTS

| KR | 100426556 B1 | 4/2004 |
| KR | 1020120109958 A | 10/2012 |

\* cited by examiner

*Primary Examiner* — Larry T Mackall
(74) *Attorney, Agent, or Firm* — William Park & Associates Ltd.

(57) ABSTRACT

Provided herein is a memory device and a storage device including the same. The memory device includes an input/output circuit configured to receive a command, an address, and data from a memory controller. The memory device also includes control logic configured to control a peripheral circuit of the memory device so that an operation of storing the data in a memory cell of the memory device is performed based on the command and the address received from the input/output circuit. The input/output circuit includes a queue layer configured to temporarily store the command and the address and to output the command and the address to the control logic based on at least one of a rising edge and a falling edge of a write enable signal received by the memory device from the memory controller.

16 Claims, 12 Drawing Sheets

MEMORY DEVICE COMPRISING QUEUE LAYER AND STORAGE DEVICE INCLUDING THE SAME

CROSS-REFERENCE TO RELATED APPLICATION

The present application claims priority under 35 U.S.C, § 119(a) to Korean patent application number 10-2021-0033365 filed on Mar. 15, 2021, in the Korean Intellectual Property Office, the entire disclosure of which is incorporated by reference herein.

BACKGROUND

1. Technical Field

Various embodiments of the present disclosure relate to an electronic device, and more particularly, to a memory device and a storage device including the memory device.

2. Related Art

A storage device is a device which stores data under the control of a host device, such as a computer or a smartphone. The storage device may include a memory device in which data is stored and a memory controller which controls the memory device. Such memory devices are classified as volatile memory devices or nonvolatile memory devices.

A volatile memory device is a memory device in which data is stored only when power is supplied and in which stored data is lost when the supply of power is interrupted, Volatile memory devices, for example, include static random access memory (SRAM) or dynamic random access memory (DRAM).

A nonvolatile memory device is a memory device in which stored data is retained even when the supply of power is interrupted. Nonvolatile memory devices, for example, include read only memory (ROM), programmable ROM (PROM), electrically programmable ROM (EPROM), electrically erasable and programmable ROM (EEPROM), or flash memory.

SUMMARY

Various embodiments of the present disclosure are directed to a memory device including a queue layer capable of processing a command and an address that are input at high speed, and a storage device including the memory device.

An embodiment of the present disclosure is directed to a memory device. The memory device may include an input/output circuit configured to receive a command, an address, and data from a memory controller. The memory device may also include control logic configured to control a peripheral circuit of the memory device so that an operation of storing the data in a memory cell of the memory device is performed based on the command and the address received from the input/output circuit. The input/output circuit may include a queue layer configured to temporarily store the command and the address and to output the command and the address to the control logic based on at least one of a rising edge and a falling edge of a write enable signal received by the memory device from the memory controller.

An embodiment of the present disclosure is directed to a storage device. The storage device may include a memory device configured to store data based on a command and an address. The storage device may also include a memory controller configured to transmit the command, the address, and the data to the memory device. The memory device may include a queue layer. The queue layer is configured to temporarily store the command and the address, received from the memory controller, and to output the command and the address to control logic of the memory device based on at least one of a rising edge and a falling edge of a write enable signal received from the memory controller.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents, or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure. Detailed description of functions and structures well known to those skilled in the art will be omitted to avoid obscuring the subject flatter of the present disclosure. This aims to omit unnecessary description so as to make the subject matter of the present disclosure clear.

Hereinafter, the present disclosure will be described in detail based on embodiments of the present disclosure with reference to the accompanying drawings.

Figure 1:
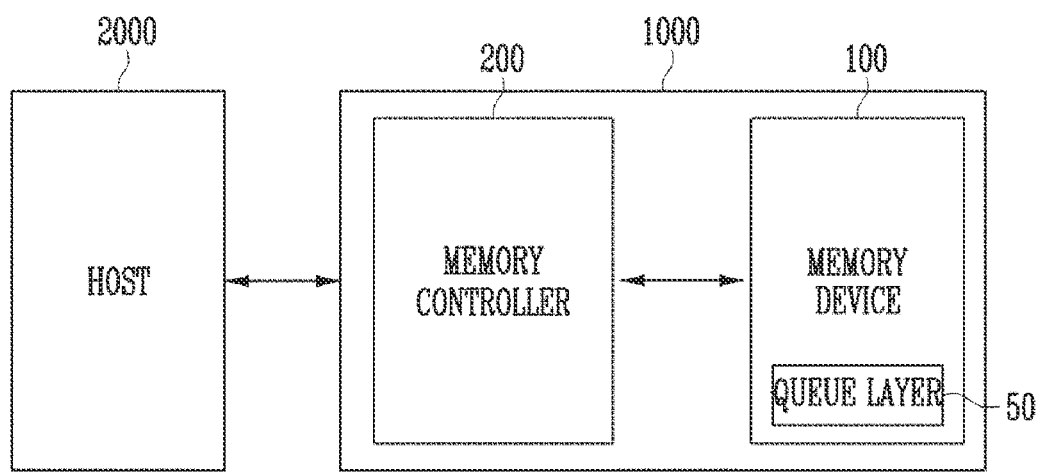
FIG. 1 is a block diagram illustrating a storage device according to an embodiment of the present disclosure.

FIG. 1 is a block diagram illustrating a storage device according to an embodiment of the present disclosure.

Referring to FIG. 1, a storage device 1000 may include a memory device 100 and a memory controller 200.

The storage device 1000 may be a device which stores data under the control of a host 2000, such as a mobile phone, a smartphone, an MP3 player, a laptop computer, a desktop computer, a game console, a display device, a tablet PC, or an in-vehicle infotainment system.

The storage device 1000 may be implemented as any one of various types of storage devices depending on a host interface that is a scheme for communication with the host 2000, For example, the storage device 1000 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 1000 may be implemented in any one of various types of package forms. For example, the storage device 1000 may be implemented in any one of various types of package forms, such as package on package (POP), system in package (SIP), system on chip (SOC), multi-chip package (MCP), chip on board (COB), wafer-level fabricated package (IFP), and wafer-level stack package (WSP).

The memory device 100 may store data or use the stored data. In detail, the memory device 100 may be operated in response to the control of the memory controller 200. Further, the memory device 100 may include a plurality of memory dies, each of which may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells, and one memory block may include a plurality of pages. Here, each page may be one unit by which data is stored in the memory device 100 or by which data stored in the memory device 100 is read.

The memory device 100 may be implemented with double data rate synchronous dynamic random access memory (DDR SDRAM), low power double data rate fourth generation (LPDDR4) SDRAM, graphics double data rate (DDDR) SDRAM, low power DDR (LPDDR) SDRAM, Rambus dynamic random access memory (RDRAM), NAND flash memory, vertical NAND flash memory, NOR flash memory device, resistive RAM (RRAM), phase-change memory (PRAM), magnetoresistive RAM (MRAM), ferroelectric RAM (FRAM), or Spin-Transfer Torque RAM (STT-RAM).

In the present specification, for convenience of description, a description will be made on the assumption that the memory device 100 includes NAND flash memory.

The memory device 100 may receive a command and an address from the memory controller 200. The memory device 100 may access an area, selected by the received address, in the memory cell array. Accessing the selected area may mean that an operation corresponding to the received command is performed on the selected area. For example, the memory device 100 may perform a write operation (i.e., a program operation), a read operation, or an erase operation. Here, the program operation may be an operation in which the memory device 100 writes data to an area selected by the address. The read operation may be an operation in which the memory device 100 reads data from an area selected by the address. The erase operation may be an operation in which the memory device 100 erases data stored in an area selected by the address.

In accordance with an embodiment of the present disclosure, the memory device 100 may include a queue layer 50, In detail, the memory device 100 may temporarily store the command and the address received from the memory controller 200 in the queue layer 50. The memory device 100 may process the command and the address that are input at high speed by including the queue layer 50. Conventional technology has evolved into a form in which data is input at high speed and the input data is processed, but the input speed of the command and the address is fixed at a certain speed (e.g., 400 Mbps). As the difference between the input speed of the command and the address and the input speed of data increases, the performance improvement of the storage device is limited. The present disclosure includes the queue layer 50 that is capable of processing a command and an address that are input at high speed, and thus the command and the address may be input at high speed, and may be input at a double data rate (DDR).

The memory controller 200 may control the overall operation of the storage device 1000.

When power is applied to the storage device 1000, the memory controller 200 may run firmware (FW). The firmware (FW) may include a host interface layer (HIL) which receives a request input from the host 2000 or outputs a response to the host 2000, a flash translation layer (FTL) which manages an operation between the interface of the host 2000 and the interface of the memory device 100, and a flash interface layer (FIL) which provides a command to the memory device 100 or receives a response from the memory device 100.

The memory controller 200 may receive data and a logical address (LA) from the host 2000, and may translate the logical address into a physical address (PA) indicating the address of memory cells which are included in the memory device 100 and in which data is to be stored. The logical address may be a logical block address (LBA), and the physical address may be a physical block address (PBA).

The memory controller 200 may control the memory device 100 so that a program operation, a read operation, or an erase operation is performed in response to a request received from the host 2000, During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

The memory controller 200 may control the memory device 100 so that a program operation, a read operation, or an erase operation is autonomously performed regardless of a request received from the host 2000. For example, the memory controller 200 may control the memory device 100 so that a program operation, a read operation, or an erase operation to be used to perform background operations, such as wear leveling, garbage collection, and read reclaim operations, is performed.

The host 2000 may communicate with the storage device 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM) and Load Reduced DIMM (LRDIMM) communication methods.

Figure 2:
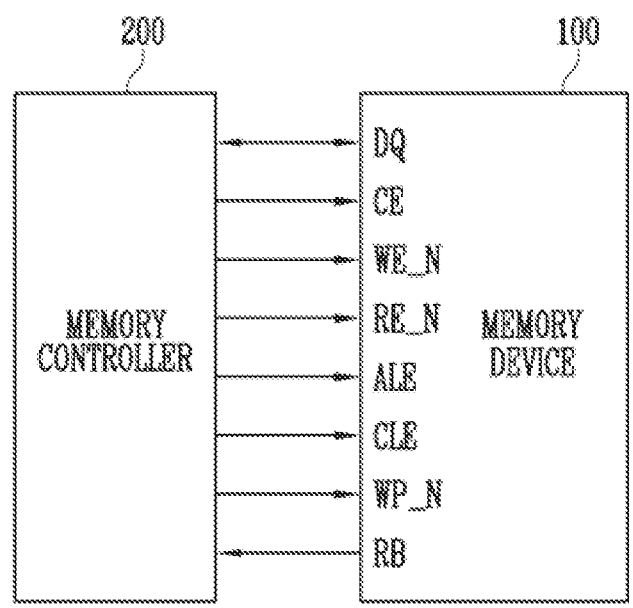
FIG. 2 is a diagram illustrating signals exchanged between a memory device and a memory controller according to an embodiment of the present disclosure.

FIG. 2 is a diagram illustrating signals exchanged between a memory device and a memory controller according to an embodiment of the present disclosure.

Referring to FIG. 2, the memory device 100 may communicate with the memory controller 200 through a data (DQ) line, a chip enable (CE) line, a write enable (WE_N) line, a read enable (RE_N) line, an address latch enable (ALE) line, a command latch enable (CLE) line, a write protect (WP_N) line, and a ready/busy (RB) line.

Although, in FIG. 2, a coupling relationship between one memory device 100 and the memory controller 200 is illustrated, this may be equally applied to coupling relationships between the memory controller 200 and a plurality of memory devices in accordance with an embodiment. For example, the data (DQ) line, the chip enable (CE) line, the write enable (WE_N) line, the read enable (RE_N) line, the address latch enable (ALE) line, the command latch enable (CLE) line, the write protect (WP_N) line, and the ready/busy (RB) line may be included in one channel, through which the memory controller 200 and the plurality of memory devices may be coupled to each other. Therefore, when the memory controller 200 transmits signals through the lines included in one channel, either all of the memory devices coupled to the corresponding channel or a memory device 100 selected by the memory controller 200 from among the memory devices coupled to the corresponding channel may receive the signals.

The data (DQ) line may input a command, an address, and data from the memory controller 200 to the memory device 100, or may output data from the memory device 100 to the memory controller 200. The data (DQ) line may be composed of eight lines so that 8 bits of data (8-bit data) may be transmitted/received, wherein each of the lines may transmit/receive one bit of data. However, the number of data (DQ) lines is not limited to 8, and it may be expanded, for example, to 16 or 32, in various embodiments.

The chip enable (CE) line may transfer a chip enable (CE) signal indicating that the memory device 100 is operable. The chip enable (CE) signal may be selectively applied to memory devices coupled to the same channel. While the chip enable (CE) signal makes a transition to a low state, for example, a low voltage state distinguished from a high voltage state, it may indicate a state in which all of operations in the memory device 100 are available. The case where the chip enable (CE) signal is in a high state may indicate that the corresponding memory device 100 is in a standby state.

The memory device 100 may receive a read enable (RE_N) signal through the read enable (RE_N) line, and may receive a write enable (WE_N) signal through the write enable (WE_N) line. The read enable (RE_N) signal may be toggled when data is loaded into the memory controller 200, and the write enable (WE_N) signal may be toggled when a command and an address are loaded into the memory device 100. In an embodiment, the command and the address may be input to the selected memory device 100 when the write enable (WE_N) signal makes a transition from low to high, that is, on the rising edge of the write enable (WE_N) signal. In an embodiment, the command and the address may be input to the selected memory device 100 when the write enable (WE_N) signal makes a transition from high to low, that is, on the falling edge of the write enable (WE_N) signal. In an embodiment, the command and the address may be input to the selected memory device 100 when the write enable (WE_N) signal makes a transition from low to high and makes a transition from high to low, that is, on the rising edge and the falling edge of the write enable (WE_N) signal.

The command latch enable (CLE) line may transfer a command latch enable (CLE) signal for inputting a command. In detail, the memory device 100 may receive the command latch enable (CLE) signal from the memory controller 200 through the command latch enable (CLE) line. Further, while a command CMD is input to the memory device 100, the command latch enable (CLE) signal may be in a high state.

The address latch enable (ALE) line may transfer an address latch enable (ALE) signal for inputting an address. Specifically, the memory device 100 may receive the address latch enable (ALE) signal from the memory controller 200 through the address latch enable (ALE) line. While an address ADDR is input to the memory device 100, the address latch enable (ALE) signal may be in a high state.

The memory device 100 may receive a write protect (WP_N) signal through the write protect (WP_N) line. The write protect (WP_N) signal may be a signal for disabling a program operation and an erase operation of the memory cell array.

While an operation is performed in the memory device 100, a ready/busy (RB) signal transferred through the ready/busy (RB) line may have a low state. When the ready/busy (RB) signal is in a low state, the memory device 100 might not exchange other signals with an external device. The case where the ready/busy (RB) signal is in a high state may indicate that the memory device 100 is in a ready state. When the memory device 100 is in the ready state, the memory device 100 may exchange signals with an external device.

Figure 3:
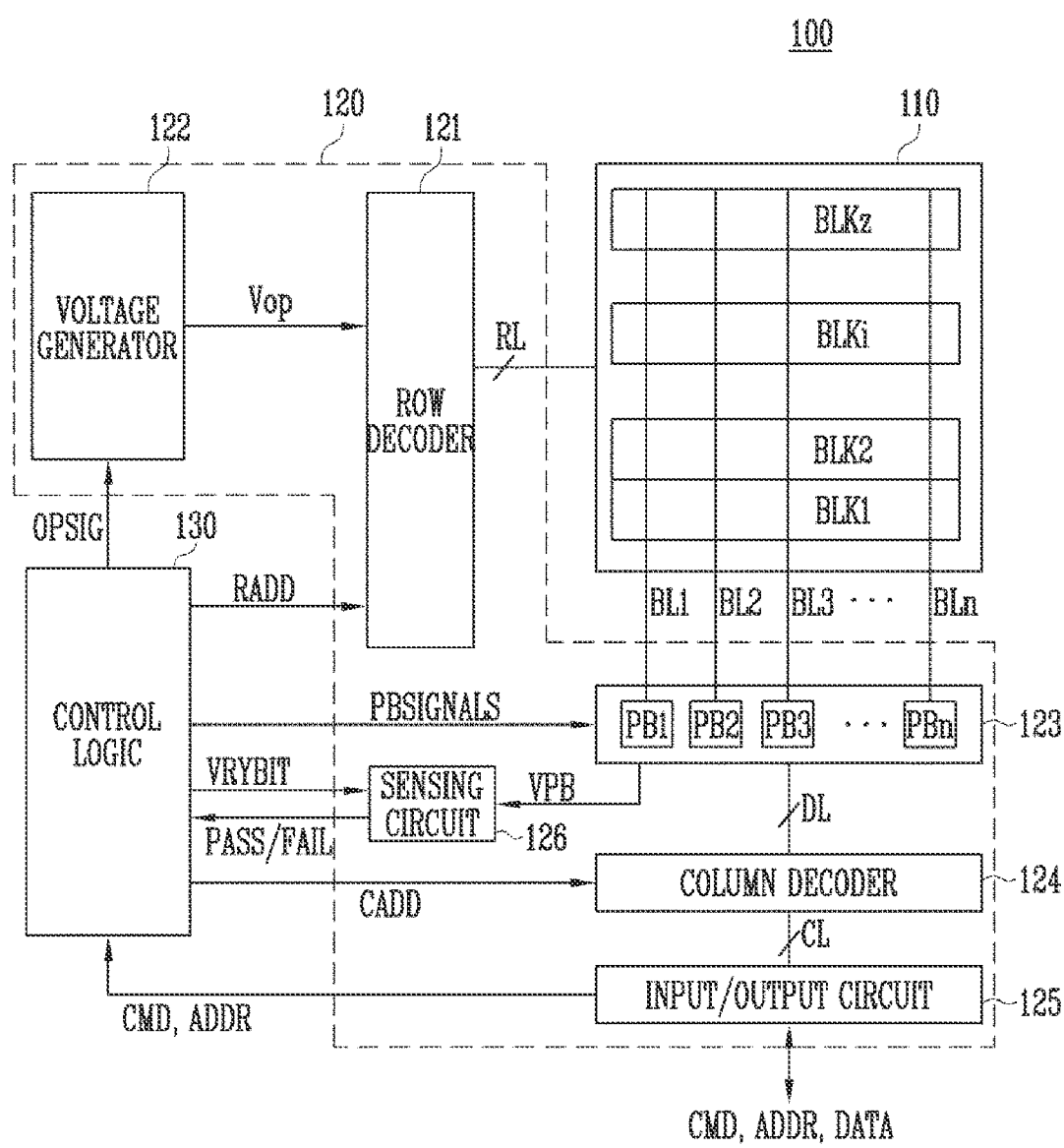
FIG. 3 is a block diagram illustrating a memory device according to an embodiment of the present disclosure.

FIG. 3 is a block diagram illustrating a memory device according to an embodiment of the present disclosure.

Referring to FIG. 3, a memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be coupled to a row decoder 121 through row lines RL. Here, the row lines RL may include at least one source select line, a plurality of word lines, and at least one drain select line. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL, The row lines RL may include the at least one source select line, the plurality of word lines, and the at least one drain select line. In an embodiment, the word lines may include normal word lines and dummy word lines. Further, the row lines RL may further include a pipe select line.

The row decoder 121 may be operated in response to control of the control logic 130, The row decoder 121 may receive a row address RADD from the control logic 130. In detail, the row decoder 121 may decode the row address RADD. The row decoder 121 may select at least one of the memory blocks BLK1 to BLKz according to the decoded address. Further; the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory cell array 110 may be performed on a memory block basis, During an erase operation, the row decoder 121 may select one memory block according to the decoded address, and may apply a ground voltage to word lines coupled to the selected memory block.

The voltage generator 122 may be operated under the control of the control logic 130. More specifically, the voltage generator 122 may generate a plurality of voltages using an external supply voltage supplied to the memory device 100 under the control of the control logic 130. For example, the voltage generator 122 may generate a program voltage, a verify voltage, a pass voltages, a read voltage, an erase voltage, etc. under the control of the control logic 130. That is, the voltage generator 122 may generate various operating voltages Vop that are used for program, read, and erase operations in response to an operation signal OPSIG.

In an embodiment, the voltage generator 122 may generate an internal supply voltage by regulating the external supply voltage. The internal supply voltage generated by the voltage generator 122 may be used as an operating voltage for the memory cell array 110.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively enabling the plurality of pumping capacitors under the control of the control logic 130. Also, the plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to n-th bit lines BL1 to BLn, respectively. Further, the first to nth page buffers PB1 to PBn may be operated under the control of the control logic 130. In detail, the first to nth page buffers PB1 to PBn may be operated in response to page buffer control signals PBSIGNALS. For example, the first to n-th page buffers PB1 to PBn may temporarily store data received through the first to n-th bit lines BL1 to BLn or may sense voltages or currents of the bit lines BL1 to BLn during a read or verify operation.

In detail, during a program operation, when a program pulse is applied to a selected word line, the first to n-th page buffers PB1 to PBn may transfer data DATA, received through the input/output circuit 125, to selected memory cells through the first to n-th bit lines BL1 to BLn. The memory cells in the selected page may be programmed based on the received data DATA. Memory cells coupled to a bit line to which a program permission voltage (e.g., a ground voltage) is applied may have increased threshold voltages. The threshold voltages of memory cells coupled to a bit line to which a program inhibition voltage (for example, a supply voltage) is applied may be maintained.

During a program verify operation, the first to n-th page buffers PB1 to PBn may read page data from the selected memory cells through the first to n-th bit lines BL1 to BLn.

During a read operation, the first to nth page buffers PB1 to PBn may read data DATA from the memory cells in the selected page through the first to n-th bit lines BL1 to BLn, and may output the read data DATA to the input/output circuit 125 under the control of the column decoder 124.

During an erase operation, the first to n-th page buffers PB1 to PBn may allow the first to n-th bit lines BL1 to BLn to float.

The column decoder 124 may transfer data between the input/output circuit 125 and the page buffer group 123 in response to a column address CADD, For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller 200, to the control logic 130, or may exchange the data DATA with the column decoder 124. In accordance with an embodiment of the present disclosure, the input/output circuit 125 may include a queue layer 50, and the input/output circuit 125 may transfer the command CMD and the address ADDR that are input at high speed to the control logic 130 using the queue layer 50.

During a read operation or a verify operation, the sensing circuit 126 may generate a reference current in response to an enable bit signal VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIG-NALS, and the enable bit signal VRYBIT in response to the command CMD and the address ADDR. The control logic 130 may be implemented as hardware, software, or a combination of hardware and software. For example, the control logic 130 may be a control logic circuit operating in accordance with an algorithm and/or a processor executing control logic code.

Further, the control logic 130 may determine whether the verify operation has passed or failed in response to the pass or fail signal PASS or FAIL. Also, the control logic 130 may control the page buffer group 123 so that verify information including the pass or fail signal PASS or FAIL is temporarily stored in the page buffer group 123. In detail, the control logic 130 may determine the program state of each memory cell in response to the pass or fail signal PASS or FAIL. For example, when the memory cell is operated as a triple-level cell (TLC), the control logic 130 may determine whether the program state of the memory cell is an erased state E or any one of first to seventh program states P1 to P7. In accordance with an embodiment of the present disclosure, the control logic 130 may set the mode of the queue layer 50. In detail, the control logic 130 may control the queue layer 50 so that the queue layer 50 is operated in any one of a single data rate (SDR) mode and a double data rate (DDR) mode.

Figure 4:
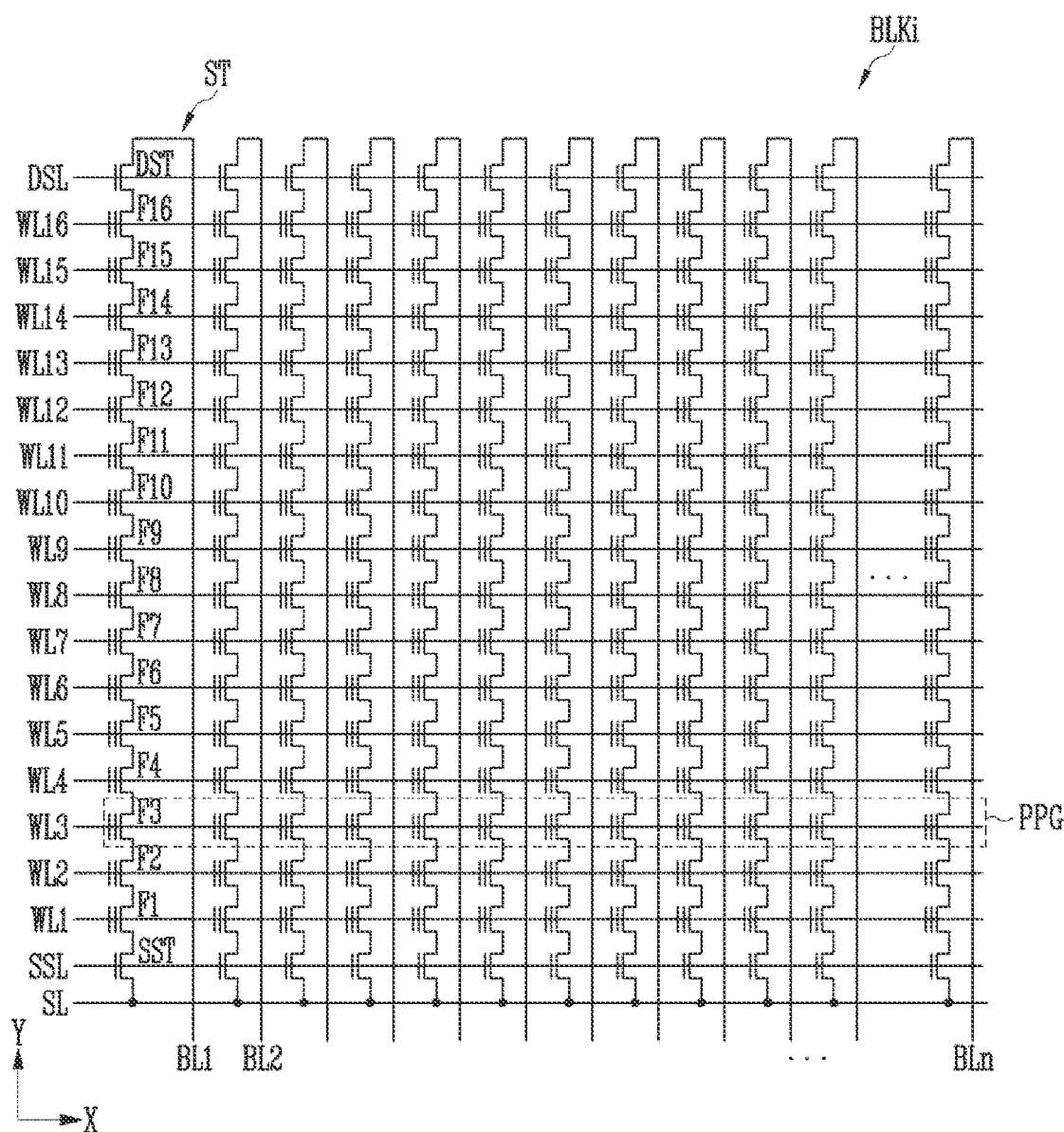
FIG. 4 is a diagram illustrating a memory block according to an embodiment of the present disclosure.

FIG. 4 is a diagram illustrating a memory block according to an embodiment of the present disclosure.

Referring to FIG. 4, a plurality of word lines arranged in parallel to each other between a first select line and a second select line may be coupled to a memory block BLKi. Here, the first select line may be a source select line SSL, and the second select line may be a drain select line DSL. In detail, the memory block BLKi may include a plurality of strings ST coupled between bit lines BL1 to BLn and a source line SL. The bit lines BL1 to BLn may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a 'physical page (PPC)'. Therefore, the memory block BLKi may include a number of physical pages (PPG) identical to the number of word lines WL1 to WL16.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

A single-level cell (SLC) may store 1 bit of data. One physical page (PPG) for single-level cells may store data corresponding to one logical page (LPG). The data corresponding to one logical page (LPG) may include a number of data bits identical to the number of cells included in one physical page (PPG).

A multi-level cell (MLC), a triple-level cell (TLC), and a quad-level cell (QLC) may store two or more bits of data. Here, one physical page (PPG) may store data corresponding to two or more logical pages (LPG).

Figure 5:
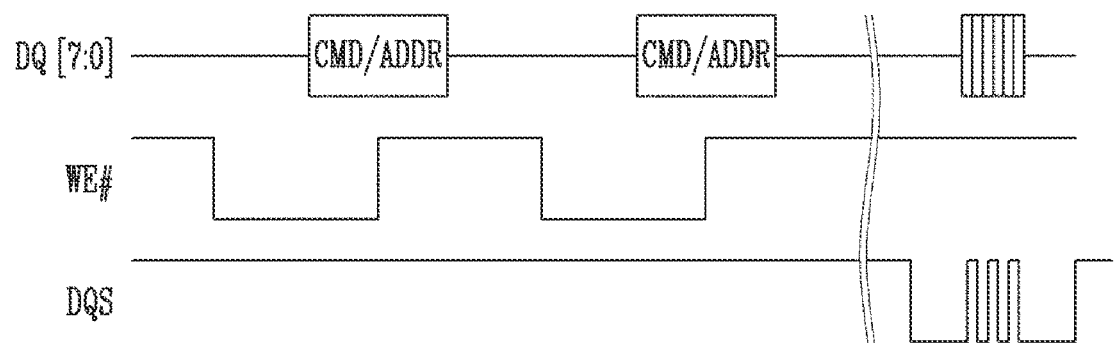
FIG. 5 is a diagram illustrating a single data rate (SDR) according to an embodiment of the present disclosure.

FIG. 5 is a diagram illustrating a single data rate (SDR) according to an embodiment of the present disclosure.

Referring to FIG. 5, a data (DQ) line, a write enable (WE #) signal, and a data strobe (DQS) signal are illustrated. The drawing in FIG. 5 is illustrated in brief so as to describe a method of inputting a command CMD, an address ADDR, and data DATA, and implementation of the present disclosure is not limited thereto.

The data (DQ) line may be a line for inputting a command, an address, and data or outputting data. In detail, the memory device 100 may receive a command, an address and data from the memory controller 200 using the data (DQ) line, or output data to the memory controller 200 using the data (DQ) line.

The write enable (WE #) signal may be toggled when the command and the address are loaded into the memory device 100. For example, the memory device 100 may load the command and the address from the memory controller 200 in response to the write enable (WE #) signal.

The data strobe (DQS) signal may be toggled when data is loaded into the memory device 100. For example, the memory device 100 may load data from the memory controller 200 in response to the data strobe (DQS) signal.

In accordance with an embodiment of the present disclosure, the memory device 100 may load the command and the address at a single data rate (SDR). Here, the SDR may be a speed (rate) at which data or the like is input on the rising edge or the falling edge of a toggled signal. Referring to FIG. 5, the memory device 100 may load the command or the address when the write enable (WE #) signal makes a transition from low to high. Meanwhile, the memory device 100 may load data at a double data rate (DDR). Here, the DDR may be a rate at which data or the like is input on the rising edge and the falling edge of a toggled signal. Referring to FIG. 5, the memory device 100 may load data when the data strobe (DQS) signal makes a transition from low to high and makes a transition from high to low.

Figure 6:
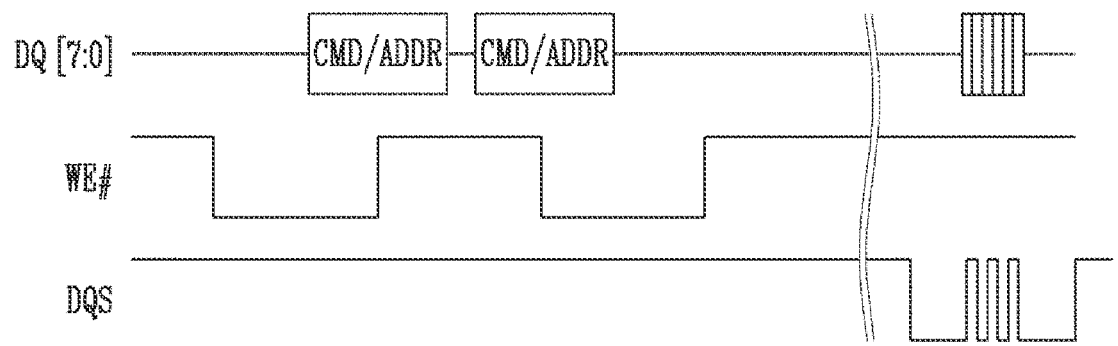
FIG. 6 is a diagram illustrating a double data rate (DDR) according to an embodiment of the present disclosure.

FIG. 6 is a diagram illustrating a double data rate (DDR) according to an embodiment of the present disclosure.

Referring to FIG. 6, a data (DQ) line, a write enable (WE #) signal, and a data strobe (DQS) signal are illustrated. The drawing in FIG. 6 is illustrated in brief so as to describe a method of inputting a command CMD, an address ADDR, and data DATA, and implementation of the present disclosure is not limited thereto.

The data (DQ) line may be a line for inputting a command, an address, and data or outputting data. In detail, the memory device 100 may receive a command, an address and data from the memory controller 200 using the data (DQ) line, or output data to the memory controller 200 using the data (DQ) line.

The write enable (WE #) signal may be toggled when the command and the address are loaded into the memory device 100. For example, the memory device 100 may load the command and the address from the memory controller 200 in response to the write enable (WE #) signal.

The data strobe (DQS) signal may be toggled when data is loaded into the memory device 100. For example, the memory device 100 may load data from the memory controller 200 in response to the data strobe (DQS) signal.

In accordance with an embodiment of the present disclosure, the memory device 100 may load a command and an address at a double data rate (DDR). Here, the DDR may be a rate at which data or the like is input on the rising edge and the falling edge of a toggled signal. Referring to FIG. 6, the memory device 100 may load the command or the address when the write enable (WE #) signal makes a transition from low to high and makes a transition from high to low. That is, the memory device 100 may load the command or the address both on the rising edge and on the falling edge of the write enable (WE #) Meanwhile, the memory device 100 may load data at a double data rate (DDR). Here, the DDR may be a rate at which data or the like is input on the rising edge and the falling edge of a toggled signal. Referring to FIG. 6, the memory device 100 may load data when the data strobe (DQS) signal makes a transition from low to high and makes a transition from high to low.

Figure 7:
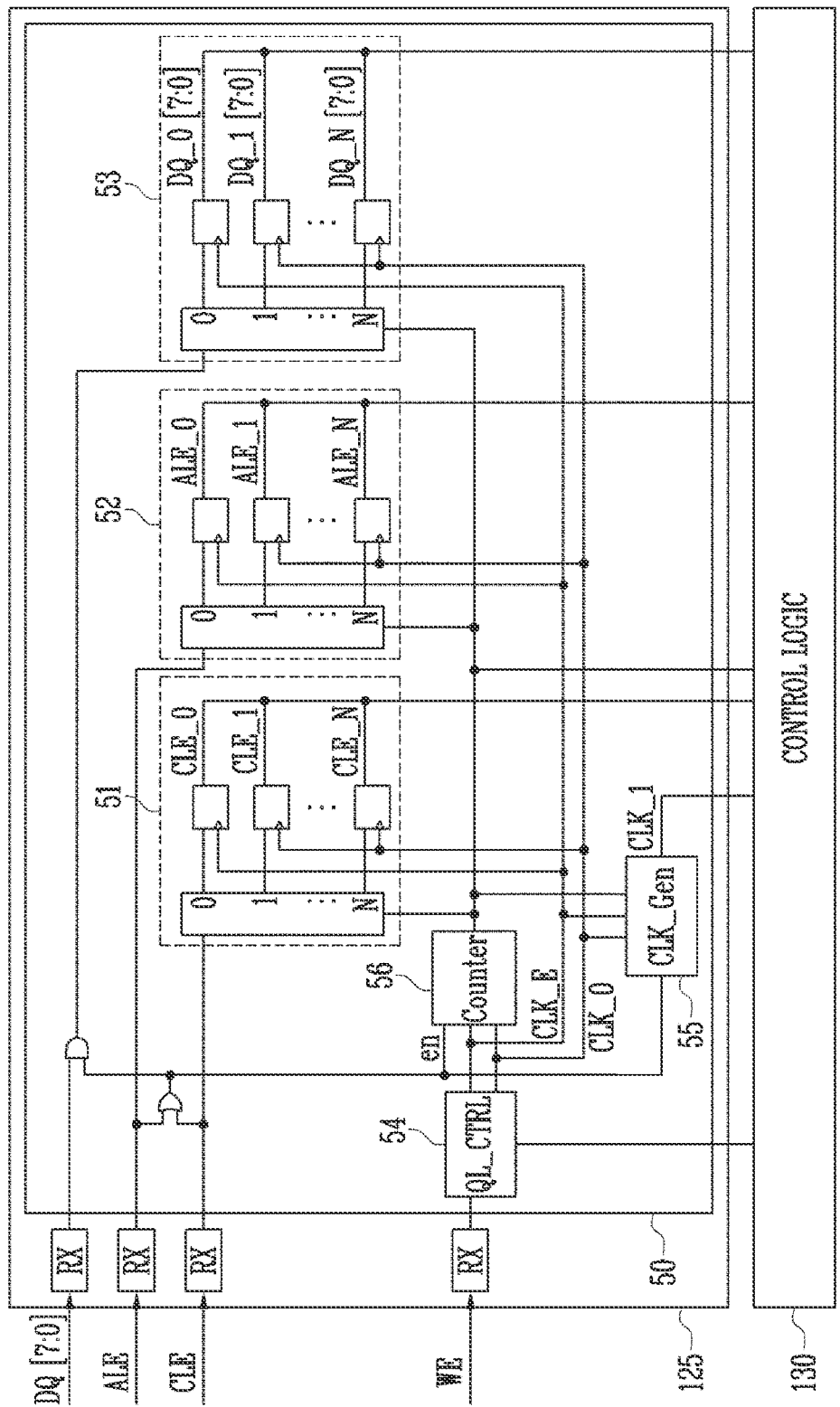
FIG. 7 is a diagram illustrating a queue layer according to an embodiment of the present disclosure.

FIG. 7 is a diagram illustrating a queue layer according to an embodiment of the present disclosure.

Referring to FIG. 7, the queue layer 50 may include a command latch 51, an address latch 52, a data latch 53, a queue layer controller 54, a clock generator 55, and a counter 56.

The command latch 51 may latch a command latch enable (CLE) signal received from the memory controller 200. In detail, the queue layer 50 may receive the command latch enable (CLE) signal from the memory controller 200 through a command latch enable (CLE) line, and may latch the received command latch enable (CLE) signal in the command latch 51. Here, latching may mean that a signal state at a certain time is temporarily maintained or memorized. That is, the command latch 51 may temporarily store the input command latch enable (CLE) signal. In accordance with an embodiment of the present disclosure, the command latch 51 may latch the command latch enable (CLE) signal that is input at high speed, and the input/output circuit 125 may input a received command to the control logic 130 in response to the command latch enable (CLE) signal, latched in the command latch 51, and a write enable (WE) signal.

The address latch 52 may latch an address latch enable (ALE) signal received from the memory controller 200. In detail, the queue layer 50 may receive the address latch enable (ALE) signal from the memory controller 200 through an address latch enable (ALE) line, and may latch the received address latch enable (ALE) signal in the address latch 52. That is, the address latch 52 may temporarily store the input address latch enable (ALE) signal. In accordance with an embodiment of the present disclosure, the address latch 52 may latch the address latch enable (ALE) signal that is input at high speed, and the input/output circuit 125 may input a received address to the control logic 130 in response to the address latch enable (ALE) signal, latched in the address latch 52, and the write enable (WE) signal.

The data latch 53 may temporarily store a command, an address, and data that are input from the memory controller 200. In detail, the queue layer 50 may receive a command, an address, and data through a data (DQ) line, and may latch the received command, address, and data in the data latch 53. That is, the data latch 53 may temporarily store the input command, address, and data. In accordance with an embodiment of the present disclosure, the data latch 53 may latch the command, the address, and the data that are input at high speed, and the input/output circuit 125 may input the command, the address, and the data to the control logic 130 in response to either the write enable (WE) signal and the command latch enable (CLE) signal or the write enable (WE) signal and the address latch enable (ALE) signal.

The queue layer controller 54 may control the overall operation of the queue layer. In detail, the queue layer controller 54 may perform control of the queue layer 50 such that the command latch 51, the address latch 52, and the data latch 53 are reset. Further, the queue layer controller 54 may perform control such that the clock generator 55 and the counter 56 are reset.

Furthermore, the queue layer controller 54 may perform control such that the operating mode of the queue layer 50 changes from an SDR mode to a DDR mode or changes from the DDR mode to the SDR mode. In detail, the queue layer controller 54 may change the operating mode of the queue layer 50 from the SDR mode to the DDR mode under the control of the control logic 130. Further, the queue layer controller 54 may control the data latch 53 so that the command or the address temporarily stored in the data latch 53 is transmitted to the control logic 130 in response to the command latch enable (CLE) signal and the address latch enable (ALE) signal that are latched in the command latch 51 and the address latch 52, respectively.

The clock generator 55 may generate a clock signal that is input to the command latch 51, the address latch 52, and the data latch 53. The command latch 51 and the address latch 52 may distribute and latch the command latch enable (CLE) signal and the address latch enable (ALE) signal in response to the dock signal generated by the dock generator 55. That is, the dock generator 55 may generate the dock signal used in an internal operation.

The counter 56 may count the write enable (WE) signal that is input to the input/output circuit 125. In detail, when the write enable (WE) signal is input from the memory controller 200, the counter 56 may count the input write enable (WE) signal. Furthermore, when a count number obtained by the counter 56 counting the write enable (WE) signal corresponds to one set of a command and an address, the queue layer controller 54 may control the dock generator 55 so that the dock generator 55 generates a signal (e.g., CLK_1) indicating that transmission of one set has been completed.

Figure 8:
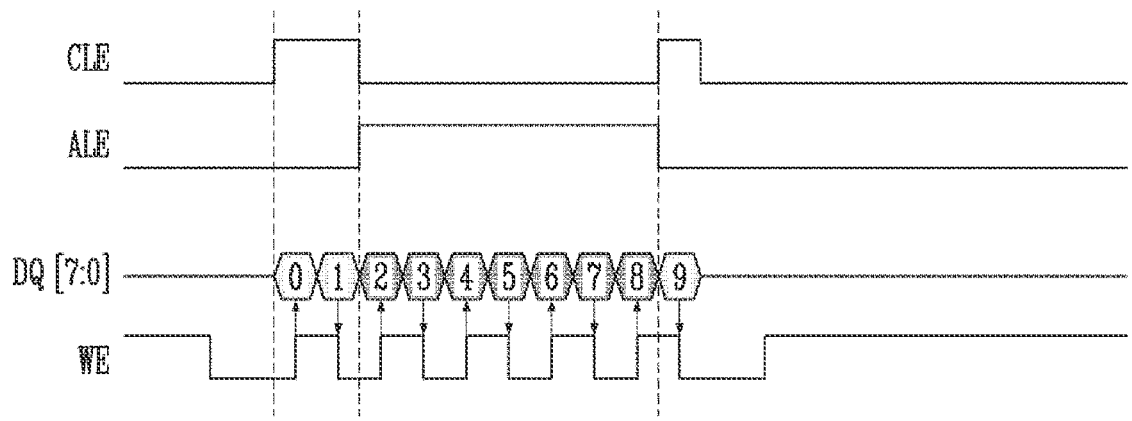
FIG. 8 is a timing diagram for describing an operation of inputting a command and an address according to an embodiment of the present disclosure.

FIG. 8 is a timing diagram for describing an operation of inputting a command and an address according to an embodiment of the present disclosure.

Referring to FIG. 8, a timing diagram of a command latch enable (CLE) signal, an address latch enable (ALE) signal, a data (DQ) line, and a write enable (WE) signal is depicted. When the command latch enable (CLE) signal in a high state is input, a command cycle may be enabled. Also, the queue layer controller 54 may receive 0-th data DQ 0 in response to the write enable (WE) signal. In detail, when the write enable (WE) signal makes a transition from low to high in the state in which the command latch enable (CLE) signal is in a high state, the queue layer controller 54 may receive the 0-th data DQ 0. Further, when the write enable (WE) signal makes a transition from high to low in the state in which the command latch enable (CLE) signal s in a high state, the queue layer controller 54 may receive first data DQ 1, When the command latch enable (CLE) signal in a low state is input, the command cycle may be disabled. Further, when the address latch enable (ALE) signal in a high state is input, an address cycle may be enabled. When the write enable (WE) signal makes a transition from low to high in the state in which the address latch enable (ALE) signal is in a high state, the queue layer controller 54 may receive second data DQ 2. Thereafter, the queue layer controller 54 may receive third data DQ 3, fourth data DQ 4, fifth data DQ 5, sixth data DQ 6, seventh data DQ 7, eighth data DQ 8, and ninth data DQ 9 on the rising edge or the falling edge of the write enable (WE) signal. Here, the 0-th data DQ 0 and the first data DQ 1 may be commands, the second data DQ 2 and the third data DQ 3 may be column addresses, the fourth data DQ 4 to the eighth data DQ 8 may be row addresses, and the ninth data DQ 9 may be a command.

Figure 9:
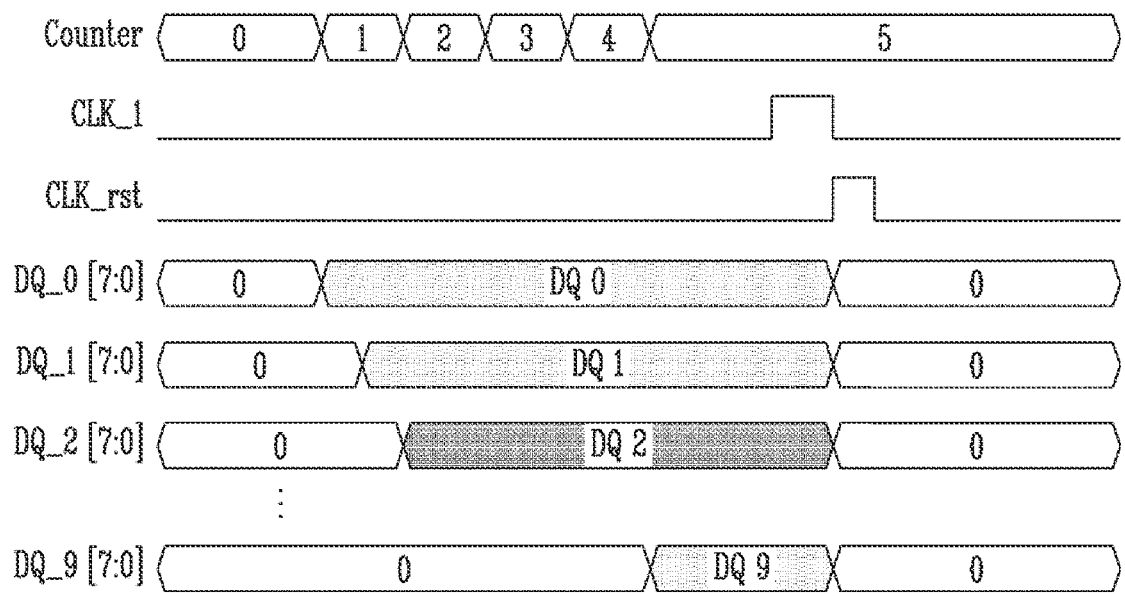
FIG. 9 is a diagram illustrating data lines according to an embodiment of the present disclosure.

FIG. 9 is a diagram illustrating data lines according to an embodiment of the present disclosure.

Referring to FIG. 9, a 0-th data line DQ_0 to a ninth data line DQ_9, a first clock signal CLK_1, a clock reset signal CLK_rst, and a count number by a counter are illustrated.

In an embodiment, each of the 0-th data line DQ_0 to the ninth data line DQ_9 may transmit/receive 8 bits of data (8-bit data). Further, each of the 0-th data line DQ_0 to the ninth data line DQ_9 may transmit a command or an address to the control logic 130. In detail, the 0-th data line DQ_0 and the first data line DQ_1 may transmit the command to the control logic 130, and the second data line DQ_2 to the eighth data line DQ_8 may transmit the address to the control logic 130. In particular, the second data line DQ_2 and the third data line DQ_3 may transmit a column address to the control logic 130, and the fourth data line DQ_4 to the eighth data line DQ_8 may transmit a row address to the control logic 130. Further, the ninth data line DQ_9 may transmit the command to the control logic 130.

Figure 10:
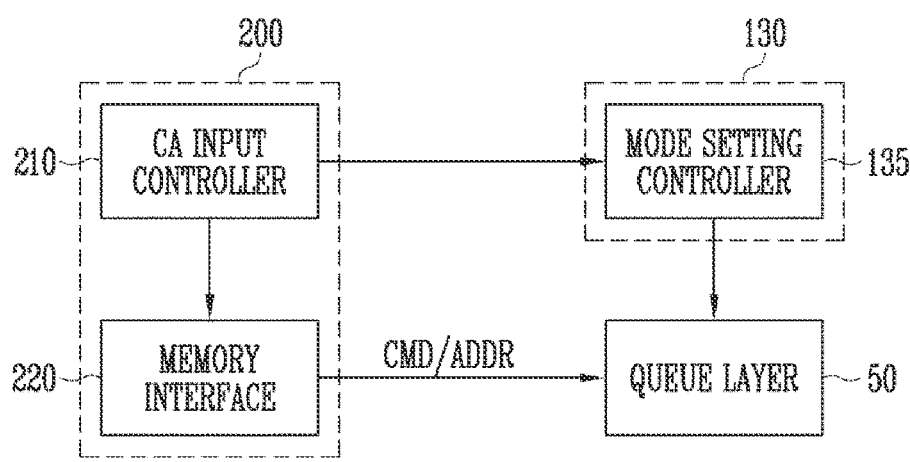
FIG. 10 is a diagram illustrating a command/address (CA) input controller according to an embodiment of the present disclosure.

FIG. 10 is a diagram illustrating a command/address (CA) input controller according to an embodiment of the present disclosure.

Referring to FIG. 10, a memory controller 200 including a CA input controller 210 and a memory interface 220, a mode setting controller 135, and a queue layer 50 are illustrated.

The memory controller 200 may input a command and an address to the memory device 100 using the memory interface 220, Further, the CA input controller 210 may control the input speed of the command and the address of the memory controller 200. More specifically, the CA input controller 210 may control the input speed of the command and the address of the memory interface 220 so that the input speed increases. The memory interface 220 may increase the input speed of the command and the address up to the speed equal to the input speed of data under the control of the CA input controller 210.

Furthermore, the CA input controller 210 may control the mode setting controller 135 included in the control logic 130 so that the operating mode of the queue layer 50 is changed. The mode setting controller 135 or the queue layer 50 may store operating mode setting information corresponding to an SDR or a DDR, and the CA input controller 210 may control the mode setting controller 135 so that the mode setting controller 135 is operated based on the operating mode setting information corresponding to SDR or DDR in a reset operation of resetting the memory device 100 or an initialization operation of setting initial parameters. The mode setting controller 135 may change the mode of the queue layer 50 so that the queue layer 50, which is operating in an SDR mode, is changed to a DDR mode or the queue layer 50, which is operating in the DDR mode, is changed to the SDR mode under the control of the CA input controller 210.

Figure 11:
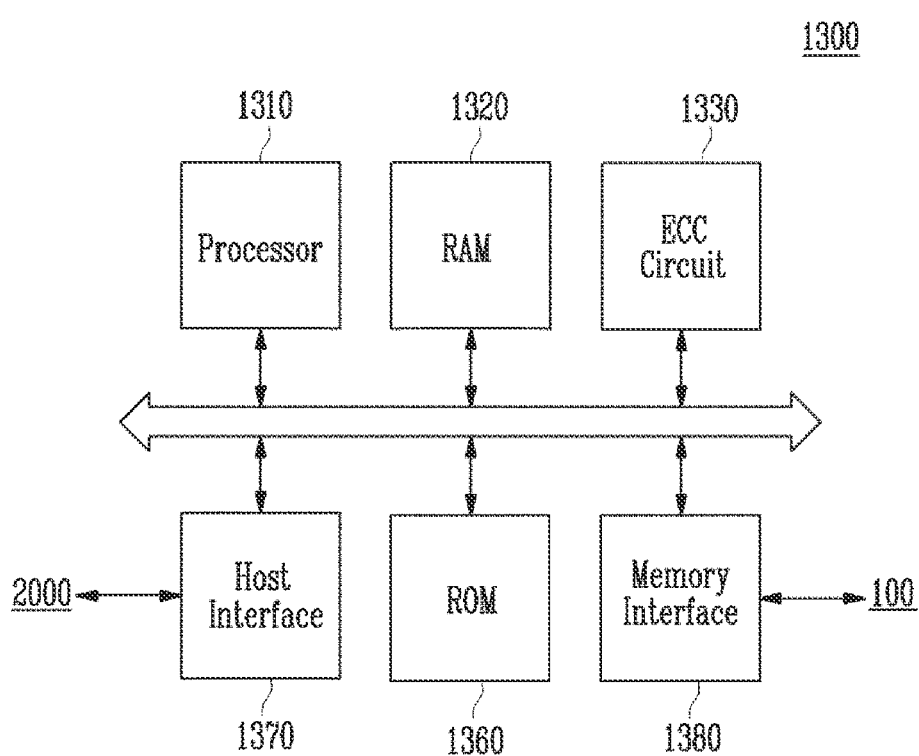
FIG. 11 is a block diagram illustrating a memory controller according to an embodiment of the present disclosure.

FIG. 11 is a block diagram illustrating a memory controller according to an embodiment of the present disclosure.

Referring to FIG. 11, a memory controller 1300 may include a processor 1310, RAM 1320, an error correction circuit (ECC circuit) 1330, ROM 1360, a host interface 1370, and a memory interface 1380. The memory controller 1300 illustrated in FIG. 11 may be an embodiment of the memory controller 200 illustrated in FIG. 1.

The processor 1310 may communicate with the host 2000 using the host interface 1370, and may perform a logical operation so as to control the operation of the memory controller 1300. For example, in response to requests received from a host 2000 or an external device, the processor 1310 may load a program command, a data file, a data structure, etc., and may perform various types of operations or generate commands and addresses. For example, the processor 1310 may generate various commands required for a program operation, a read operation, an erase operation, a suspend operation, and a parameter setting operation.

Also, the processor 1310 may perform a function of a flash translation layer (FTL). The processor 1310 may translate a logical block address (LBA), provided by the host 2000, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

Further, the processor 1310 may generate commands without receiving a request from the host 2000. For example, the processor 1310 may generate commands for background operations such as operations for wear leveling of the memory device 100 and operations for garbage collection of the memory device 100.

The RAM 1320 may be used as a buffer memory, a working memory or a cache memory of the processor 1310, The RAM 1320 may store codes and commands that are executed by the processor 1310. The RAM 1320 may store data that is processed by the processor 1310. Further, in implementation of the RAM 1320, the RAM 1320 may be implemented to include static RAM (SRAM) or dynamic RAM (DRAM).

The error correction circuit 1330 may detect errors and correct the detected errors during a program operation or a read operation. In detail, the error correction circuit 1330 may perform an error correction operation based on error correction code (ECC). Also, the error correction circuit 1330 may perform error correction encoding (ECC encoding) based on data to be written to the memory device 100. The ECC-encoded data may be transferred to the memory device 100 through the memory interface 1380. Further, the error correction circuit 1330 may perform error correction decoding (ECC decoding) on data received from the memory device 100 through the memory interface 1380.

The ROM 1360 may be used as a storage unit which stores various types of information required for the operation of the memory controller 1300, In detail, the ROM 1360 may include a map table, in which physical-logical address information and logical-physical address information may be stored. Further, the ROM 1360 may be controlled by the processor 1310.

The host interface 1370 may include a protocol for performing data exchange between the host 2000 and the memory controller 1300. In an embodiment, the controller 1370 may communicate with the host 2000 through at least one of various interface protocols such as a universal serial bus (USB) protocol, a multimedia card (MMC) protocol, a peripheral component interconnection (PCI) protocol, a PCI-express E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1380 may communicate with the memory device 100 using a communication protocol under the control of the processor 1310. In detail, the memory interface 1380 may transmit/receive commands, addresses, and data to/from the memory device 100 through a channel. For example, the memory interface 1380 may include a NAND interface.

Figure 12:
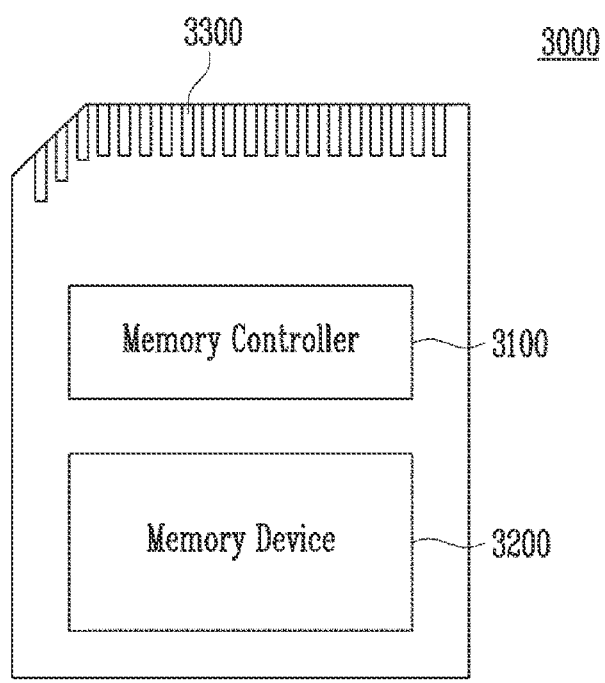
FIG. 12 is a diagram illustrating a memory card system according to an embodiment of the present disclosure.

FIG. 12 is a diagram illustrating a memory card system according to an embodiment of the present disclosure.

Referring to FIG. 12, a memory card system 3000 may include a memory controller 3100, a memory device 3200, and a connector 3300.

The memory controller 3100 may be electrically coupled to the memory device 3200, and may access the memory device 3200. For example, the memory controller 3100 may control read, write, erase, and background operations of the memory device 3200. The memory controller 3100 may provide an interface between the memory device 3200 and a host. Also, the memory controller 3100 may run firmware for controlling the memory device 3200.

For example, the memory controller 3100 may include components, such as a RAM, a processing unit, a host interface, a memory interface, and an error correction circuit.

The memory controller 3100 may communicate with an external device through the connector 3300. The memory controller 3100 may communicate with an external device (e.g., a host) based on a specific communication protocol. In an embodiment, the memory controller 3100 may communicate with the external device through at least one of various communication protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (DATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 3300 may be defined by at least one of the above-described various communication protocols.

In an embodiment, the memory device 3200 may be implemented as any of various nonvolatile memory devices, such as those including Electrically Erasable and Programmable ROM (EEPROM), NAND flash memory, NOR flash memory, Phase-change RAM (PRAM), Resistive RAM (ReRAM), Ferroelectric RAM (FRAM and Spin-Transfer Torque Magnetic RAM (STT-MRAM).

The memory controller 3100 and the memory device 3200 may be integrated into a single semiconductor device to form a memory card. For example, the memory controller 3100 and the memory device 3200 may be integrated into a single semiconductor device, and may then form a memory card such as a PC card (i.e., personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 13:
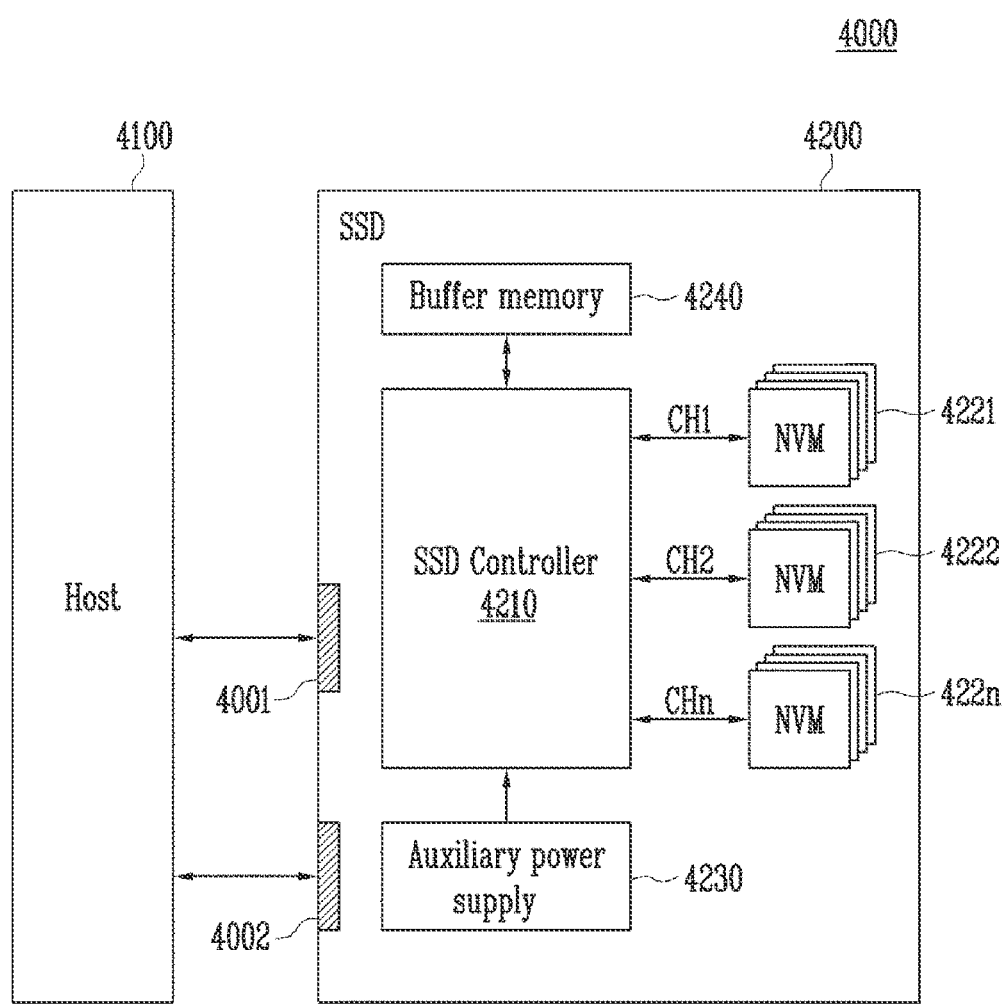
FIG. 13 is a diagram illustrating a solid state drive (SSD) system according to an embodiment of the present disclosure.

FIG. 13 is a diagram illustrating a solid state drive (SSD) system according to an embodiment of the present disclosure.

Referring to FIG. 13, an SSD system 4000 may include a host 4100 and an SSD 4200. The SSD 4200 may exchange a signal SIG with the host 4100 through a signal connector 4001, and may be supplied with power PWR through a power connector 4002. The SSD 4200 may include an SSD controller 4210, a plurality of flash memories 4221 to 422$n$, an auxiliary power supply 4230, and a buffer memory 4240.

In an embodiment, the SSD controller 4210 may perform a function of the memory controller 200, described above with reference to FIG. 1. The SSD controller 4210 may control the plurality of flash memories 4221 to 422$n$ in response to the signal SIG received from the host 4100. In an embodiment, the signal SIG may indicate signals based on the interfaces of the host 4100 and the SSD 4200, For example, the signal SIG may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied with power PWR from the host 4100, and may be charged. The auxiliary power supply 4230 may supply the power of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may function as a buffer memory of the SSD 4200. For example, the buffer memory 4240 may temporarily store data received from the host 4100 or data received from the plurality of flash memories 4221 to 422$n$, or may temporarily store metadata (e.g., mapping tables) of the flash memories 4221 to 422$n$. The buffer memory 4240 may include volatile memories, such as DRAM, SDRAM, DDR SDRAM, LPDDR SDRAM, and GRAM, or nonvolatile memories, such as FRAM, ReRAM, STT-MRAM, and PRAM.

Figure 14:
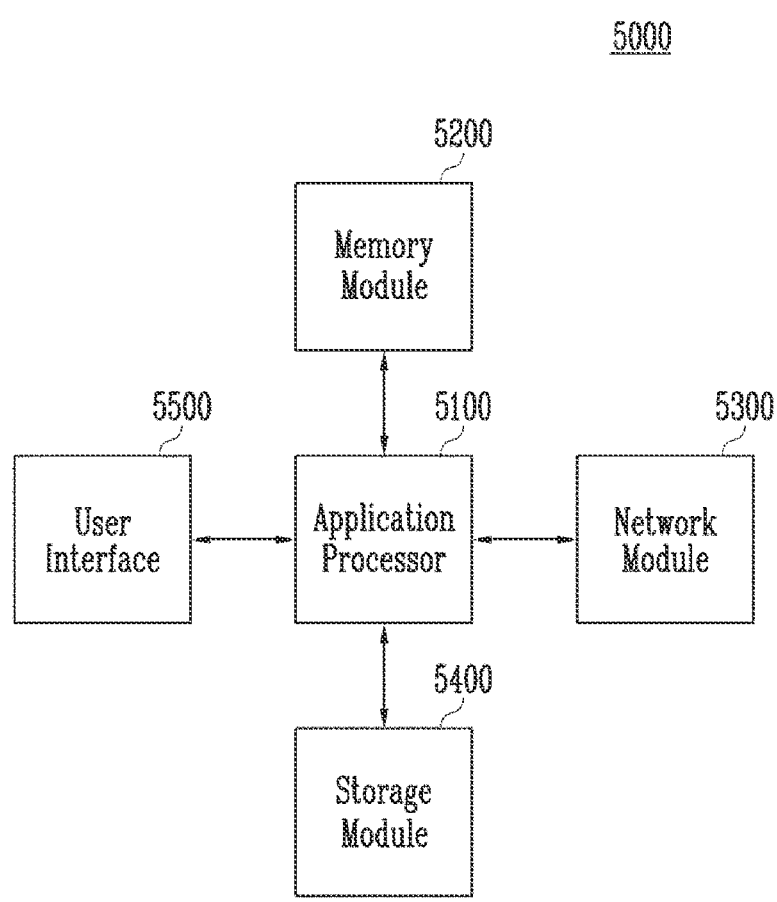
FIG. 14 is a diagram illustrating a user system according to an embodiment of the present disclosure.

FIG. 14 is a diagrams illustrating a user system according to an embodiment of the present disclosure.

Referring to FIG. 14, a user system 5000 may include an application processor 5100, a memory module 5200, a network module 5300, a storage module 5400, and a user interface 5500.

The application processor 5100 may execute components included in the user system 5000, an operating system (OS), a user program or the like. In an embodiment, the application processor 5100 may include controllers, interfaces, graphic engines, etc, for controlling the components included in the user system 5000. The application processor 5100 may be provided in the form of a system-on-chip (SoC).

The memory module 5200 may function as main memory, working memory, buffer memory or cache memory of the user system 5000. The memory module 5200 may include volatile RAM such as DRAM, SDRAM, DDR SDRAM, DDR2 SDRAM, DDR3 SDRAM, LPDDR SDARM, LPDDR2 SDRAM, and LPDDR3 SDRAM or nonvolatile RAM such as PRAM, ReRAM, MRAM, and FRAM. In an embodiment, the application processor 5100 and the memory module 5200 may be packaged based on a package-on-package (POP), and may then be provided as a single semiconductor package.

The network module 5300 may communicate with external devices. In an embodiment, the network module 5300 may support wireless communication, such as code division multiple access (CDMA), global system for mobile communication (GSM), wideband CDMA (WCDMA), CDMA-2000, time division multiple access (TDMA), long term evolution (LTE), Wimax, wireless LAN (WLAN), UWB, Bluetooth, or WiFi. In an embodiment, the network module 5300 may be included in the application processor 5100.

The storage module 5400 may store data. For example, the storage module 5400 may store data received from the application processor 5100. Alternatively, the storage module 5400 may transmit the data stored in the storage module 5400 to the application processor 5100. In an embodiment, the storage module 5400 may be implemented as a nonvolatile semiconductor memory device, such as those including Phase-change RAM (PRAM), Magnetic RAM (MRAM), Resistive RAM (RRAM), NAND flash memory, NOR flash memory, or NAND flash memory having a three-dimensional (3D) structure. In an embodiment, the storage module 5400 may be provided as a removable storage medium (removable drive), such as a memory card or an external drive of the user system 5000.

In an embodiment, the storage module 5400 may include a plurality of nonvolatile memory devices, each of which may be operated in the same manner as the memory device, described above with reference to FIGS. 1 to 10. The storage module 5400 may be operated in the same manner as the storage device 1000, described above with reference to FIG. 1.

The user interface 5500 may include interfaces which input data or instructions to the application processor 5100 or output data to an external device. In an embodiment, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 5500 may include user output interfaces such as an a liquid crystal display (LCD), an organic light-emitting diode (OLED) display device, an active matrix OLED (AMOLED) display device, an LED, a speaker, and a monitor.

In accordance with the present disclosure, there are provided a memory device including a queue layer capable of processing a command and an address that are input at high speed, and a storage device including the memory device.

What is claimed is:

1. A memory device, comprising:
an input/output circuit configured to receive a command, an address, and data from a memory controller; and
a control logic circuit configured to communicate with the input/output circuit and to control a peripheral circuit of the memory device so that an operation of storing the data in a memory cell of the memory device is performed based on the command and the address received from the input/output circuit,
wherein the input/output circuit comprises
a queue layer comprising:
a command latch configured to communicate with the memory controller through a command latch enable line and to latch a command latch enable signal input from the memory controller;
an address latch configured to communicate with the memory controller through an address latch enable line and to latch an address latch enable signal input from the memory controller;
and a data latch configured to communicate with the memory controller through a data line to temporarily store the command, the address, and the data,
wherein the control logic circuit is configured to communicate with the command latch, the address latch and the data latch, and
wherein the queue layer is configured to temporarily store the command and the address and to output the command and the address to the control logic circuit based on at least one of a rising edge and a falling edge of a write enable signal received by the memory device from the memory controller.

2. The memory device according to claim 1, wherein the queue layer further comprises:
a queue layer controller configured to control the queue layer such that the command and the address are output from the queue layer to the control logic circuit;
a counter configured to count a number of toggles in the write enable signal; and
a clock generator configured to generate an internal clock signal corresponding to the command and the address.

3. The memory device according to claim 2, wherein the queue layer controller is configured to output the command or the address to the control logic circuit in response to the command latch enable signal or the address latch enable signal.

4. The memory device according to claim 1, wherein the queue layer is configured to receive the command and the address from the memory controller in a double data rate (DDR) mode.

5. The memory device according to claim 4, wherein the queue layer is configured to output the command and the address to the control logic circuit in a single data rate (SDR) mode.

6. The memory device according to claim 1, wherein the control logic circuit is configured to change a mode, in which the command and the address are received, from a single data rate (SDR) mode to a double data rate (DDR) mode under control of the memory controller.

7. The memory device according to claim 6, wherein the control logic circuit comprises:
a mode setting controller configured to set operating information corresponding to the SDR mode and the DDR mode.

8. The memory device according to claim 1, wherein the queue layer is configured such that an input speed of the command and the address that are input from the memory controller to the input/output circuit is higher than an output speed of the command and the address that are output to the control logic circuit.

9. A storage device, comprising:
a memory device configured to store data based on a command and an address; and
a memory controller configured to transmit the command, the address, and the data to the memory device,
wherein the memory device comprises a queue layer comprising:

a command latch configured to communicate with the memory controller through a command latch enable line and to latch a command latch enable signal input from the memory controller;

an address latch configured to communicate with the memory controller through an address latch enable line and to latch an address latch enable signal input from the memory controller;

and a data latch configured to communicate with the memory controller through a data line to temporarily store the command, the address, and the data, wherein the queue layer is configured to temporarily store the command and the address, received from the memory controller, and to output the command and the address to a control logic circuit of the memory device based on at least one of a rising edge and a falling edge of a write enable signal received from the memory controller, and wherein the control logic circuit is configured to communicate with the command latch, the address latch and the data latch.

10. The storage device according to claim 9, wherein the queue layer further comprises:

a queue layer controller configured to control the queue layer such that the command and the address are output from the queue layer to the control logic circuit;

a counter configured to count a number of toggles in the write enable signal; and a clock generator configured to generate an internal clock signal corresponding to the command and the address.

11. The storage device according to claim 10, wherein the queue layer controller is configured to output the command or the address to the control logic circuit in response to the command latch enable signal or the address latch enable signal.

12. The storage device according to claim 9, wherein the queue layer is configured to receive the command and the address from the memory controller in a double data rate (DDR) mode.

13. The storage device according to claim 12, wherein the queue layer is configured to output the command and the address to the control logic circuit in a single data rate (SDR) mode.

14. The storage device according to claim 9, wherein the memory controller is configured to control the queue layer so that a mode changes from a single data rate (SDR) mode to a double data rate (DDR) mode.

15. The storage device according to claim 14, wherein the control logic circuit comprises:

a mode setting controller configured to set operating information corresponding to the SDR mode and the DDR mode.

16. The storage device according to claim 9, wherein the storage device is configured such that an input speed of the command and the address that are input from the memory controller to the queue layer is higher than an output speed of the command and the address that are output from the queue layer to the control logic circuit.

* * * * *